United States Patent [19]
Takao

[11] Patent Number: 4,906,524
[45] Date of Patent: Mar. 6, 1990

[54] SURFACE-COATED ARTICLE AND A METHOD FOR THE PREPARATION THEREOF

[75] Inventor: Toshihiro Takao, Tokyo, Japan
[73] Assignee: Orient Watch Co., Ltd., Tokyo, Japan
[21] Appl. No.: 197,405
[22] Filed: May 23, 1988
[30] Foreign Application Priority Data
   May 29, 1987 [JP] Japan .................. 62-131772
[51] Int. Cl.$^4$ ................ B32B 15/04; B32B 15/08
[52] U.S. Cl. .................... 428/336; 428/457; 428/469; 428/701
[58] Field of Search ............ 428/469, 701, 457, 336; 501/153

[56] References Cited

U.S. PATENT DOCUMENTS

| | | | |
|---|---|---|---|
| 3,026,210 | 3/1962 | Cobb | 501/153 |
| 4,517,217 | 5/1985 | Hoffman | 428/469 X |
| 4,659,629 | 4/1987 | Gartner et al. | 428/469 |
| 4,689,270 | 8/1987 | Deckelmann et al. | 428/469 X |
| 4,689,271 | 8/1987 | Schittenhelm et al. | 428/469 X |
| 4,704,328 | 11/1987 | Imao et al. | 428/70 X |
| 4,720,419 | 1/1988 | Cairns | 428/469 X |
| 4,726,983 | 2/1988 | Harada et al. | 428/469 |

*Primary Examiner*—Thomas J. Herbert
*Attorney, Agent, or Firm*—Wenderoth, Lind & Ponack

[57] ABSTRACT

A metal shaped article, of which aesthetic value is of importance, such as watch cases, is provided with a coating layer of a ceramic composition containing a limited amount of magnesium oxide as an essential ingredient, the balance being silicon dioxide, aluminum oxide, titanium dioxide and the like, and having a limited thickness. The ceramic-based coating layer can be deposited on the substrate surface by a dry process such as ion plating. The substrate article can be provided with excellent protection against abrasion and corrosion by the ceramic-based coating layer without affecting the beautiful appearance of the substrate surface only when the ceramic composition contains the specified amount of magnesium oxide and the ceramic-based coating layer has a specified thickness.

8 Claims, 1 Drawing Sheet

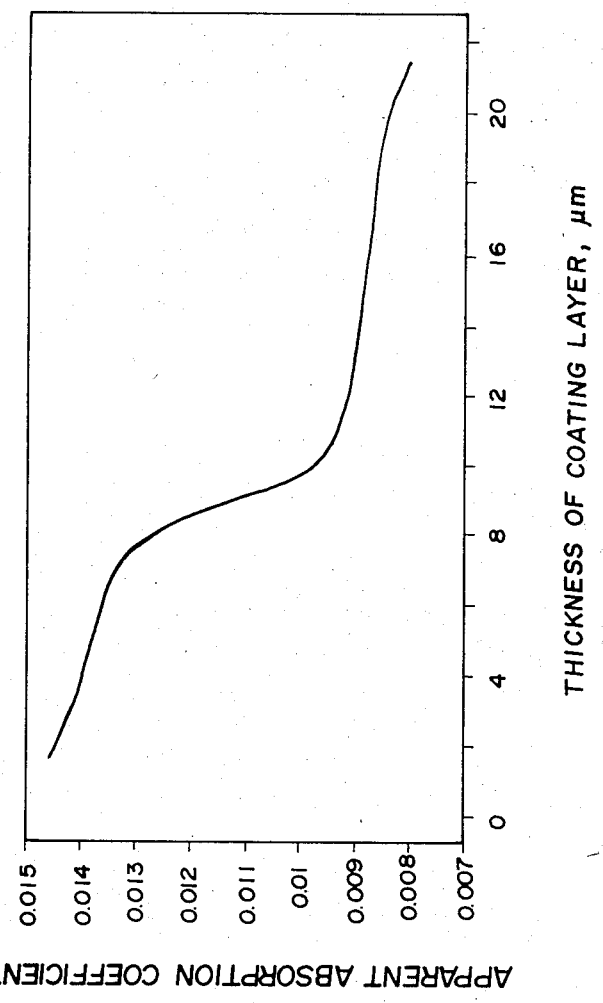

SURFACE-COATED ARTICLE AND A METHOD FOR THE PREPARATION THEREOF

BACKGROUND OF THE INVENTION

The present invention relates to a surface-coated article and a method for the preparation thereof. More particularly, the invention relates to a shaped article provided with a hard and transparent ceramic-based coating film having high abrasion resistance and decorativeness without masking the beautiful appearance of the substrate surface as well as a method for the preparation of such a surface-coated article.

It is widely practiced that various kinds of metal articles such as personal ornamentals including watch cases and straps, necklaces, rings, spectacle frames, brooches, bracelets, earrings, medals and badges, orders and the like, tablewares, music instruments and so on are provided on the surface of a substrate body shaped of a metal or alloy such as stainless steels, nickel-based alloys, copper and copper-based alloys and the like with a metallic plating layer of gold, silver, platinum, rhodium, palladium, chromium and the like with an object to impart an impressive appearance of high-class goods.

A serious problem in these metal-made surface-plated articles is that the plating layer is sometimes subject to mechanical damages, falling and wearing during transportation and use when the article is contacted with a hard body or receives a mechanical shock to greatly decrease the commercial value and usefulness of the article.

Accordingly, it is also a practice widely undertaken in the prior art that the surface of personal ornamentals, musical instruments and the like is provided on the surface of the plating layer with a protective coating film formed by applying a clear and colorless lacquer in order to avoid the troubles mentioned above as far as possible. Such an organic coating film is not quite satisfactory in respect of the protecting effect due to the relatively poor abrasion resistance, corrosion resistance and weatherability.

It is also proposed that metal-plated surfaces are provided with a transparent inorganic coating layer of a ceramic material such as alumina, silica, zirconia, titanium dioxide and the like (see, for example, Japanese Patent Kokai Nos. 56-123366, 56-163266 and 61-165731. When such an inorganic transparent ceramic coating layer is formed on the surface of a metal or glass body by a conventional method such as vacuum vapor deposition, ion plating, chemical vapor deposition, sputtering and the like, some undesirable phenomena are sometimes unavoidable such as appearance of an interference color, discoloration and cloudiness in the coating layer to badly mask and affect the beautiful appearance of the substrate surface. Therefore, the applicability of these prior art methods is limited. In particular, the problem due to the above mentioned undesirable phenomena is serious on the surface of articles having a three-dimensionally complicated configuration such as watch cases and other personal ornamentals so that the above mentioned prior art methods are hardly applicable to these articles.

Apart from the above mentioned methods for forming transparent ceramic-based coating layers, ceramic bodies having transparency are known and obtained by a sintering process of a powdery mixture of aluminum oxide with 0.05 to 0.5% by weight of magnesium oxide (see, for example, U.S. Pat. No. 3,026,210). According to the process disclosed therein, aluminum sulfate and a magnesium salt are blended together in such a proportion that the weight ratio of $Al_2O_3$:$MgO$ is 99.95:0.05 to 99.5:0.5 after calcination and sintering and the powdery mixture is calcined first at a temperature up to 1100° C. and then at a temperature of 1200° to 1300° C. to prepare a calcined aluminum oxide powder containing magnesium oxide. The calcined aluminum oxide powder is then shaped and subjected to sintering by a heat treatment first at 800° to 1200° C. in air and then at about 1800° C. for 6 to 10 hours in an atmosphere of hydrogen gas or in vacuum. The principle by which transparency is imparted to the thus sintered body is that formation of pores in the grains and abnormal grain growth are prevented by utilizing the phenomenon of grain-boundary precipitation of spinel $MgAl_2O_4$.

This method for the preparation of a transparent alumina-based ceramic is of course not applicable to the formation of a ceramic-based thin protective coating layer on a metal-made and plated substrate article because the process disclosed so far gives only a shaped body of the ceramic material per se having bulkiness or a substantial thickness not to meet the definition of a thin coating film and, moreover, the temperature at which sintering of the ceramic body is performed is so high that not only the metal-made substrate body but also the layer of metal plating on the substrate surface have absolutely no possibility to withstand the temperature.

SUMMARY OF THE INVENTION

The present invention accordingly has as an object to provide a surface-coated shaped article having a ceramic-based hard and transparent coating layer on the surface by which protection is imparted against mechanical damages, abrasion and corrosion to the substrate surface which may be liable to be mechanically damaged as in a metal-plated surface or subject to discoloration such as the surface of silver, copper and the like without affecting the color or appearance of the substrate surface.

Thus, the surface-coated shaped article of the present invention comprises:
  (a) a substrate body; and
  (b) a coating layer having a thickness in the range from 0.5 to 8 μm formed on the surface of the substrate body and made of a ceramic composition comprising from 5 ppm to 40% by weight of magnesium oxide, the balance being one or more of other specified oxides.

The method of the present invention for the preparation of the above defined surface-coated shaped article comprises: forming a coating layer on the surface of a substrate body by a dry-process plating method with a ceramic composition comprising from 5 ppm to 40% by weight of magnesium oxide to such an extent that the coating layer has a thickness in the range from 0.5 to 8 μm.

It is optional that the above mentioned dry-process plating of a magnesium oxide-containing ceramic composition is preceded by a process of undercoating with a known undercoating material such as metals, metal oxides, synthetic resins and the like. It is further optional that the above mentioned dry-process plating of a magnesium oxide-containing ceramic composition is succeeded by a process of top-coating with a known top-coating material such as synthetic resins and the like.

BRIEF DESCRIPTION OF THE DRAWING

The FIGURE is a graphic showing of the apparent light-absorption coefficient of a magnesium oxide-containing alumina-based coating layer as a function of the thickness.

DETAILED DESCRIPTION OF THE PREFERRED EMBODIMENTS

As is described above, the characteristic feature of the present invention is in the unique chemical composition of the ceramic-based hard and transparent coating layer comprising magnesium oxide as an essential ingredient, which layer having a specified thickness and being formed by a dry-process plating method. The invention has been completed on the basis of a discovery obtained by extensive investigations undertaken with the above mentioned object which can be achieved when the substrate surface is provided with a coating layer of a specified thickness formed of a magnesium oxide-containing ceramic composition by means of a dry-process plating method.

Different from the above mentioned magnesium oxide-containing alumina-based transparent sintered ceramic body disclosed in U.S. Pat. No. 3,026,210, the transparent ceramic-based coating layer in the invention has an amorphous structure in which no grain-boundary precipitation of the magnesium oxide constituent takes place with uniform distribution thereof throughout the layer as a result of the method for forming the coating layer.

The magnesium oxide-containing ceramic composition, from which the ceramic-based coating layer is formed on the substrate surface by a dry-process plating method, contains magnesium oxide in such an amount that the coating layer formed therefrom contains from 5 ppm to 40% by weight or, preferably, from 10 ppm to 30% by weight or, more preferably, from 0.1% to 15% by weight of magnesium constituent calculated as magnesium oxide MgO. When the content of magnesium oxide therein is too low, high transparency of the coating layer can hardly be obtained. When the content of magnesium oxide is too high, on the other hand, the coating layer has somewhat degraded properties in respect of impact strength, corrosion resistance and the like.

As the balance of magnesium oxide which is the essential ingredient in the above mentioned weight proporiton, the ceramic coating layer formed on the substrate surface should comprise one or more of other inorganic oxide materials exemplified by aluminum oxide, silicon dioxide, germanium oxide, zirconium dioxide, hafnium oxide, titanium dioxide, zinc oxide, indium oxide, tin oxide, beryllium oxide, yttrium oxide, vanadium oxide, tungsten oxide, bismuth oxide, selenium oxide, lanthanum oxide, neodymium oxide, tellurium oxide and rhenium oxide as well as composite oxides such as PZT, i.e. zirconium titanium plumbate Pb(Zr.Ti)O$_3$ and the like, of which aluminum oxide, silicon dioxide, titanium dioxide, zirconium dioxide, zinc oxide, indium oxide, tin oxide, beryllium oxide, ytrium oxide and zirconium titanium plumbate are preferred. The vaporization source used in the process of ion plating is a powdery mixture of one or more of these oxide materials with magnesium oxide although it is optional to use a composite oxide such as spinel MgAl$_2$O$_4$ in place of a powdery mixture of magnesium and alminum oxides. Further, the vaporization source can be a powdery mixture of magnesium oxide and a elementary metal such as metallic titanium and the ion plating is performed in an atmosphere containing oxygen in a limited partial pressure so that the metallic ions are deposited in the form of an oxide after oxidation in the atmosphere.

The ceramic-based hard and transparent coating layer formed on the substrate surface should preferably have a thickness in the range from 0.5 to 8 μm. This limitation in the thickness of the coating layer has been established as a result of extensive experimentation. Namely, a coating layer having a too small thickness has limited abrasion resistance and is subject to the appearance of an interference color. When the thickness of the coating layer is too large, on the other hand, the ceramic layer is somewhat couldy to have decreased transparency. This upper limit of the thickness of the coating layer has been established experimentally. Thus, several glass plates as a substrate were provided with a ceramic-based coating layer having a varied thickness and composed of 90% by weight of aluminum oxide and 10% by weight of magnesium oxide and the intensity ratios of the transmitted light to the incident light $I_t/I_0$ were determined. Assuming that $I_t/I_0$ is given by the equation $$I_t/I_0 = e^{-\alpha t} \text{ or } \alpha = -(1/t)\log_e I_t/I_0,$$

in which t is the thickness of the coating layer in μm and α is the apparent absorption coefficient in $\mu m^{-1}$, the value of α was calculated as a function of t by substituting the determined value of $I_t/I_0$ in the equation. The figure in the accompanying drawing is a graphic showing of the thus obtained values of a as α function of t. As is evident from the figure, the value of a is no longer constant but decreases as the thickness t is increased with a quasi-plateau region up to a thickness of about 8 μm and rapid decrease thereafter corresponding to the loss of transaprency, presumably, due to increase in the scattering of light.

The material of which the substrate body or the surface layer thereof is formed is not particularly limitative provided that the material can withstand the conditions of the dry-process plating. Examples of the materials to which the inventive method is applicable include precious metals such as gold, silver, platinum, rhodium, palladium and the like and non-precious metals such as copper, iron, nickel and the like as well as alloys thereof. Any shaped articles having a surface plated with these metallic materials can of course be used. Glassy materials and plastics are also suitable with or without a metallic plating layer thereon provided that the softening point thereof is high enough to withstand the dry-process plating.

Various known methods for dry-process plating are applicable to the invention for forming the ceramic-based coating layer including vacuum vapor deposition, ion plating, sputtering, chemical vapor deposition and the like, of which sputtering and ion plating methods are preferred or ion plating method is more preferred in respect to the relatively low temperature at which the process is performed, relatively large rate of deposition of the ceramic composition and high bonding strength between the substrate surface and the ceramic-based coating layer deposited thereon. The method of vacuum vapor deposition is disadvantageous in respect to the low bonding strength between the substrate surface and the coating layer. The rate of deposition can not always be satisfactorily high in the method of sputtering. The method of chemical vapor deposition is not applicable to a substrate made of a relatively low melting point such as brass and the like since the substrate must be kept at a considerably high temperature in order to obtain a high rate of deposition.

In practicing the method of ion plating, the ceramic composition as the vaporization source is heated under bombardment with electron beams and vaporized to form an ionized gaseous species in the atmosphere in which the ions are accelerated and deposited on to the substrate surface under a potential difference. The process of ion plating is classified into several types including the low-pressure DC ion plating performed in an atmosphere of argon of a relatively low pressure of 1 to $2.5 \times 10^{-2}$ torr, high-vacuum ion plating performed in an atmosphere of a pressure not exceeding $1 \times 10^{-3}$ torr and activated reactive vapor-deposition performed in an atmosphere of an active gas. The method of high-vacuum ion plating is further classified relative to the manners of heating, ionization, ion acceleration and the like into the Banshah type, hollow-cathode type, radio-frequency (RF) type, clustered ion-beam type and so on.

The above mentioned RF type ion plating method is referred in practicing the inventive method for forming the ceramic-based coating layer in respect of the sustainability of stable electric discharge without particularly controlling the operation of the electron gun, possibility of stable vaporization of a substance having a low vapor pressure under the practicable conditions in a high vacuum and possibility of giving a dense coating layer free from pin holes.

It is optional according to need to provide the substrate surface beforehand with an undercoating layer having a thickness of, for example, 5 to 200 nm with an object to improve the reproducibility in the bonding strength between the ceramic-based transparent coating layer and the substrate surface and to improve the abrasion resistance and corrosion resistance. Examples of suitable undercoating materials include metals such as aluminum, titanium, chromium, nickel and the like and metal oxides such as titanium dioxide, silicon dioxide, indium oxide, zinc oxide and the like as well as hard synthetic resins curable by ultraviolet irradiation or by heating. When the substrate is made of silver, in particular, an undercoating treatment prior to the ion plating is desirable because, different from the surface of gold and glassy materials, no sufficiently high and reproducible bonding strength can be obtained between the ceramic-based coating layer formed by ion plating and the substrate surface due to the chemical activity of the silver surface which is also subject to blackening or appearance of cloudiness as a result of abnormal grain growth.

The method of the present invention is applicable to various substrates including watch cases and straps, necklaces rings, spectacle frames, medals and badges, orders, metal tablewares, metal music instruments and the like without particular limitations relative to the configuration. When the substrate is an article having a chance of contacting with perspiration, such as watch cases and straps, rings, spectacle frames and the like, it is advantageous that the ceramic-based transparent coating layer is provided with a top-coating layer of a water-resistant material such as a poly(tetrafluoroethylene) resin, polycarbonate resin, polyethylene, acrylic resin, nylon, polyacetal resin and the like. The top-coating layer can be formed by any known method such as vapor deposition, application of a liquid coating composition and the like. If necessary, the top-coating layer is subjected to a post-treatment of curing, for example, by ultraviolet irradiation.

As is described above, the present invention is advantageous in several respects. Thus, the ceramic-based hard and transparent coating layer formed according to the inventive method is firmly bonded to the substrate surface without appearance of the interference color or coloration of the coating layer per se so that any substrate articles can be imparted with high abrasion resistance without affecting the appearance of the substrate surface. Therefore, certain metallic materials, such as silver, copper, brass and the like, which hitherto have not used as a material for personal ornamentals and tablewares due to the low hardness and chemical properties liable to mechanical damages and discoloration, can be used in these applications when the articles are provided with the hard and transparent ceramic-based coating layer according to the invention. Accordingly, the present invention is applicable to various metal articles such as personal ornamentals, e.g., watch cases and straps, necklaces, rings, spectacle frames, medals and badges, orders and the like, tablewares, music instruments and so on.

In the following, the present invention is described in more detail by way of examples. The hard and transparent ceramic-based coating layers formed in the following examples were evaluated by conducting testing for the following items.

(1) Abrasion-resistance test

The ceramic-coated article was rubbed against an abrasive #1000 corundum powder under a load of 5 kg/cm² by 100 times repetition of a reciprocating movement over a 15 cm span at a velocity of about 10 cm/second and examined visually with the aid of a magnifying glass for the appearance of bare surface of the substrate. The results were recorded as "good" for the surface without bare portions and "no good" for the surface with appearance of bare portions.

(2) Accelerated weatherability test

An apparatus for accelerated weathering (Sunshine Weather Meter) was run for 500 hours under ultraviolet irradiation to detect any changes on the coated surface.

(3) Thermal shock test

The coated article was subjected to twice-repeated cycles of heating at 200° C. and then putting into water at 0° C. to detect any changes on the coated surface.

(4) CASS test

An aqueous test solution containing 4% by weight of sodium chloride and 0.02% by weight of copper (II) chloride was sprayed in fine droplets against the coated article for 48 hours and then the number of the corrosion spots on the surface was counted.

(5) Bending test

The coated article held by a vise was forcibly bent by about 90° and inspected for falling of the coating layer to give a measure for the bonding strength of the coating layer to the substrate surface.

(6) Resistance against artificial perspiration

The coated article was kept in contact with a standard artificial perspiration for 100 hours at room temperature and then visually examined for the changes in the appearance.

(7) Resistance against sulfurization

The coated article was exposed to a hydrogen sulfide-containing atmosphere according to the procedure specified in JIS H 8502 and then visually examined for the changes in the appearance.

(8) Impact strength test

Measurement was performed according to the procedure specified in JIS B 7001.

EXAMPLE 1

Silver-plated and gold-plated watch cases were provided with a hard and transparent ceramic-based coating layer having a thickness of about 2 $\mu$m by the RF ion plating method using a powdery mixture composed of 40% by weight of magnesium oxide and 60% by weight of aluminum oxide as the vaporization source.

The procedure of ion plating was performed in an atmosphere of argon gas under a pressure of $5 \times 10^{-4}$ torr for 40 minutes by keeping the substrate at a temperature of 200° C. and heating the vaporization source with an electron gun after 10 minutes of argon-ion bombardment treatment of the substrate with RF electric power supply of 500 watts.

The thus formed ceramic-based coating layer was analyzed by using an electron-probe microanalyzer to find that the coating layer was composed of about 10% by weight of magnesium oxide and about 90% by weight of aluminum oxide.

The thus formed ceramic-based coating layers each had high clarity without appearance of an interference color and the results of the evaluation tests were: good in the abrasion test; no corrosion spots found in the CASS test; no changes found in the weatherability test; no falling of the coating layer in the bending test; and no changes found in the thermal shock test.

EXAMPLE 2

A silver-plated bracelet was provided with a ceramic-based coating layer having a thickness of about 2 $\mu$m under substantially the same conditions as in Example 1 excepting the use of spinel MgAl$_2$O$_4$ as the vaporization source in place of the powdery mixture of magnesium oxide and aluminum oxide. The coating layer formed in this manner contained about 12% by weight of magnesium oxide. The results of the evaluation tests of the thus coated bracelet were as good as the watch cases in Example 1.

EXAMPLE 3

A silver-plated, stainless steel spectacle frame was provided with a ceramic-based coating layer having a thickness of about 1 $\mu$m under substantially the same conditions as in Example 1 except that the vaporization source was a 50:50 by weight mixture of aluminum oxide and steatite MgSiO$_3$ and the length of time for the ion plating treatment was about 20 minutes. The thus formed ceramic-based coating layer was composed of an amorphous mixture of magnesium oxide MgO, silicon dioxide SiO$_2$ and aluminum oxide Al$_2$O$_3$, of which the content of magnesium oxide was about 10% by weight. The beautiful appearance of the silver-plated substrate surface was retained after the ceramic coating. The evaluation tests of the thus coated spectacle frame gave substantially the same satisfactory results as the watch cases in Example 1.

EXAMPLE 4

A silver-plated, stainless steel tableware was provided with a ceramic-based coating layer having a thickness of about 5 $\mu$m under substantially the same conditions as in Example 1 except that the vaporization source was a powdery mixture composed of 10% by weight of magnesium oxide and 90% by weight of matallic titanium and the ion plating treatment was performed for about 60 minutes in an atmosphere with a partial pressures of argon and oxygen of $3 \times 10^{-4}$ torr and $2 \times 10^{-4}$ torr, respectively. The thus formed coating layer was composed of an amorphous mixture of magnesium oxide and titanium dioxide, of which the content of magnesium oxide was about 3% by weight. The results of the evaluation tests of the thus obtained coated article were as satisfactory as in Example 1.

EXAMPLE 5

A silver-plated, brass watch case was placed in an ion-plating chamber and subjected to an argon-ion bombardment treatment for about 10 minutes with application of an electric field of 500 volts DC in a plasma generated in an atmosphere of argon gas under a pressure of $5 \times 10^{-4}$ torr with supply of a RF electric power of 500 watts. Thereafter, the watch case was provided with an undercoating layer of aluminum having a thickness of about 0.1 $\mu$m by evaporating aluminum with an electron gun in the same chamber. Further, the watch case was provided with a ceramic-based coating layer having a thickness of about 2 $\mu$m in substantially the same procedure as in Example 1. Finally, a top-coating layer having a thickness of about 0.5 $\mu$m was formed thereon by evaporating a poly(tetrafluoroethylene) resin from a resistance-heated boat installed in the same chamber. The thus obtained multiple-coated watch case retained the beautiful appearance of the silver-plated substrate surface little affected despite the undercoating of aluminum and had much higher corrosion-resistance, in particular, against the artificial perspiration than the same silver-plated watch case without the coating treatment.

EXAMPLE 6

A silver-plated, brass watch case was placed in an ion-plating chamber and subjected to an argon-ion bombardment treatment for about 10 minutes with application of an electric field of 200 volts DC in a plasma generated in an atmosphere of argon gas under a pressure of $5 \times 10^{-4}$ torr with supply of RF electric power of 1 kilowatt. Thereafter, the watch case was provided with an undercoating layer having a thickness of about 0.2 $\mu$m by evaporating titanium with an electron gun in an atmosphere of oxygen under a pressure of $5 \times 10^{-4}$ torr. Further, the watch case was provided with a ceramic-based coating layer having a thickness of about 2 $\mu$m in substantially the same procedure as in Example 1. Finally, the watch case was taken out of the ion-plating chamber and coated with an ultraviolet-curable clear lacquer to form a top-coating layer of a cured acrylic resin having a thickness of about 0.5 $\mu$m. The thus obtained multiple-coated watch case retained the beautiful appearance of the silver-plated substrate surface little affected despite the undercoating of aluminum and had excellent corrosion resistance, in particular, against the artificial perspiration.

EXAMPLE 7

The same silver-plated watch case as used in Example 1 was provided with a ceramic-based coating layer having a thickness of about 2 $\mu$m under substantially the same conditions as in Example 1 followed by a top-coating treatment to form a top-coating layer of poly(tetra-fluoro-ethylene) resin having a thickness of about 0.1 μm by evaporating the resin from a resistance-heated vaporization vessel installed in the same ion-plating chamber. The thus obtained multiple-coated watch case retained the beautiful appearance of the silver-plated substrate surface and had excellent corrosion resistance, in particular, against the artificial perspiration and sulfurizing atmosphere in about the same degree as in the watch case prepared in Example 5.

EXAMPLE 8

A silver-plated, brass watch case was first subjected to an argon-ion bombardment treatment under substantially the same conditions as in example 6 excepting that the RF electric power was 500 watts and then provided with a ceramic-based coating layer having a thickness of about 2 μm under substantially the same conditions as in Example 1 except that the vaporization source was a powdery mixture of aluminum oxide and about 0.1% by weight of magnesium oxide. The thus formed ceramic-based coating layer was composed of amorphous alumina containing about 5 ppm by weight of magnesium oxide according to the results of the secondary ion mass-spectrometric analysis. The thus obtained watch case retained the beautiful appearance of the silver-plated substrate surface and had excellent properties including relatively high abrasion resistance except that the strength of the coating layer in the bending test was somewhat inferior as compared to those containing a higher amount of magnesium oxide

EXAMPLE 9

A silver-plated watch case was first provided with an undercoating layer having a thickness of about 1 μm by coating with an ultraviolet-curable acrylic resin. The undercoated watch case was then subjected to an argon-ion bombardment treatment under substantially the same conditions as in Example 5 except that the radio-frequency electric power was increased to 1 kilowatt and further provided with a ceramic-based coating layer having a thickness of about 1 μm under substantially the same conditions as in Example 1 except that the temperature of the substrate was controlled not to exceed 100° C. Finally, the watch case was provided with a top-coating layer having a thickness of about 1 μm by coating with and curing of an ultraviolet-curable acrylic resin. The thus obtained watch case had excellent abrasion resistance and corrosion resistance against the artificial perspiration as well as high impact strength of the coating layer.

What is claimed is:

1. A surface-coated shaped article which comprises:
   (a) a metallic substrate body: and
   (b) a coating layer formed by ion plating, said coating layer having a thickness in the range of 0.5 to 8 μm formed on the surface of the substrate body and made of a ceramic composition comprising from 5 ppm to 40% by weight of magnesium oxide, the balance being at least one oxide selected from the group consisting of aluminum oxide, silicon dioxide, germanium oxide, zirconium dioxide, hafnium oxide, titanium dioxide, zinc oxide, indium oxide, tin oxide, beryllium oxide, yttrium oxide, vanadium oxide, tungsten oxide, bismuth oxide, selenium oxide, lanthanum oxide, neodymium oxide, tellurium oxide, rhenium oxide and zirconium titanium plumbate.

2. The surface-coated shaped article as claimed in claim 1 wherein the coating layer is made of a ceramic composition comprising from 5 ppm to 40% by weight of magnesium oxide, the balance being at least one oxide selected from the group consisting of aluminum oxide, silicon dioxide, titanium dioxide, zirconium dioxide, zinc oxide, indium oxide, tin oxide, beryllium oxide, yttium oxide and zirconium titanium plumbate.

3. The surface-coated shaped article as claimed in claim 1 which further comprises:
   (c) an undercoating layer between the substrate surface and the coating layer of the ceramic composition.

4. The surface-coated shaped article as claimed in claim 3 wherein the undercoating layer is made of a material selected from the group consisting of metals, synthetic resins, titanium dioxide, silicon dioxide, indium oxide and zinc oxide.

5. The surface-coated shaped article as claimed in claim 3 wherein the undercoating layer has a thickness in the range from 5 to 200 nm.

6. The surface-coated shaped article as claimed in claim 1 which further comprises:
   (d) a top-coating layer on the coating layer of the ceramic composition.

7. The surface-coated shaped article as claimed in claim 6 wherein the top-coating layer is made of a synthetic resin.

8. The surface-coated shaped article as claimed in claim 1 which further comprises:
   (c) an undercoating layer between the substrate surface and the coating layer of the ceramic composition; and
   (d) a top-coating layer on the coating layer of the ceramic composition.

* * * * *